United States Patent [19]

Shinko et al.

[11] 4,402,925

[45] Sep. 6, 1983

[54] POROUS FREE STANDING PYROLYTIC BORON NITRIDE ARTICLES

[75] Inventors: Julius S. Shinko; Thomas C. Keyes, both of Bay Village, Ohio

[73] Assignee: Union Carbide Corporation, Danbury, Conn.

[21] Appl. No.: 306,385

[22] Filed: Sep. 28, 1981

[51] Int. Cl.³ .............................................. C01B 21/06
[52] U.S. Cl. ...................................... 423/290; 264/81
[58] Field of Search ........................... 423/290; 264/81

[56] References Cited

U.S. PATENT DOCUMENTS

| | | | |
|---|---|---|---|
| 3,152,006 | 10/1964 | Basche | 427/255.2 |
| 3,607,042 | 9/1971 | Arber et al. | 423/290 |
| 4,058,579 | 11/1977 | Lashway | 264/81 |
| 4,096,297 | 6/1978 | Pappis et al. | 423/290 X |
| 4,257,810 | 3/1981 | Narumiya | 75/69 X |

FOREIGN PATENT DOCUMENTS

| | | | |
|---|---|---|---|
| 2014972 | 9/1979 | United Kingdom | 423/290 |
| 596659 | 3/1978 | U.S.S.R. | 427/255.2 |

OTHER PUBLICATIONS

"Reticulated Vitreous Carbon" Four page sales brochure pub. 1976 by Chemotronics International, Inc., Ann Arbor, Mich.
"Vitreous Carbon-A New Form of Carbon" by F. C. Cowlard & J. C. Lewis, Journal of Materials Science, vol. 2, No. 6, Nov. 1967, pp. 509-511.

*Primary Examiner*—O. R. Vertiz
*Assistant Examiner*—J. Leeds
*Attorney, Agent, or Firm*—Robert C. Cummings

[57] ABSTRACT

A sponge-like free-standing pyrolytic boron article is made by reacting ammonia and gaseous boron halide diluted with an non-oxidizing gas to deposit pyrolitic boron nitride on a porous substrate such as open-pored vitreous carbon under a vacuum and then removing the substrate as by oxidation.

22 Claims, 3 Drawing Figures

POROUS FREE STANDING PYROLYTIC BORON NITRIDE ARTICLES

Numerous applications exist in the chemical, metallurgical and pharmaceutical fields for an open mesh structure which is electrically non-conductive, mechanically strong, chemically pure and chemically stable. These include applications as filters, sieves or membranes in high temperature or corrosive environments and in processes requiring extremely pure materials.

Pyrolytic boron nitride, or PBN as it is commonly referred to, possesses all of the above desirable properties as well as being thermally stable at temperatures up to 700° C. Until the present invention, however, PBN has been available only as a solid or an impervious coating. We have now discovered a practical method of producing free-standing porous article of PBN, thereby providing an open mesh material with all of the desirable physical and chemical properties of PBN. Such material could be used, for example, as the membrane in an aluminum reclamation cell.

PBN is produced commercially as a dense, laminar, anisotropic solid, by a chemical vapor deposition process as taught in U.S. Pat. No. 3,152,006. In this claimed process vapors of ammonia and a gaseous boron halide are interreacted within the temperature range between 1450° C. and 2300° C. and at a pressure below about 50 Torr. Efforts to use this process to deposit PBN on a porous surface have resulted in a dense, solid, surface coating with very little penetration of the porous structure.

We have now discovered that PBN can be deposited throughout an open-pored substrate by modifications of the existing PBN deposition techniques which include diluting the reaction vapor with a large percentage of a non-oxidizing diluent such as nitrogen. This dilution retards the rate of deposition of the PBN and thereby permits full penetration of the reactant gases. Our process employs an open-pored porous substrate of a material which can be readily oxidized or otherwise removed after being coated with PBN. After the PBN has coated the walls of the voids of the substrate, the substrate is oxidized to a gas or powder or otherwise treated to facilitate its removal to leave a free standing open mesh structure of PBN.

The substrate for the process of the invention can be an open-pored sponge-like structure of a material which is readily oxidized or otherwise reacted or treated to facilitate its removal after the PBN is deposited. A suitable substrate material will remain stable at temperatures up to about 2000° C. (in the absence of oxygen) and will not react with the gases used to form PBN. A porous substrate suitable for use in the invention will have from 5 to 200 pores per lineal inch and from 70 to 4400 square feet of surface area per cubic foot. A preferred porous carbon substrate is a vitreous carbon material made by carbonizing a foamed plastic such as polurethane, urea, phenolic or the like.

According to our process a suitable porous substrate is placed in a vacuum chamber, which is evacuated to a pressure below 50 Torr, and the substrate is gradually heated to a temperature of about 1100° to 2000° C. A temperature of 1700° to 2000° C. is preferred because when PBN is deposited at temperature below 1700° C. the coating is subject to degradation in the presence of moisture. A pressure of about 0.4 Torr and a temperature of about 1875° C. are most preferred. When the desired temperature has been reached a stream of ammonia diluted with a non-oxidizing gas and a stream of gaseous boron halide diluted with a non-oxidizing gas are introduced. Nitrogen is the preferred diluent although other non-oxidizing gases such as argon or hydrogen can be employed if desired. The preferred boron halide is boron trichloride.

The ratio of ammonia to boron halide injected into the chamber is from 2.0 to 3.0 parts by volume of ammonia per part of boron halide, with about 2.7 parts preferred. The ammonia is diluted with from 1.0 to 3.0 parts by volume of non-oxidizing gas per part of ammonia, with about 1.85 parts preferred, while the boron halide gas is diluted with from about 10 to 15 parts by volume of non-oxidizing gas per part of boron halide, with about 13 parts preferred. The influx of gases and removal of gases from the chamber as the deposition reaction occurrs in the substrate is controlled to maintain the pressure between 0.2 and 0.5 Torr with about 0.4 Torr preferred.

The reaction is continued until the desired amount of PBN has been formed on the substrate. The time required will vary with the diluent gas and the ratios employed, as well as with the desired degree of penetration of the substrate and desired build-up of PBN. As a general rule the penetration of the reactant into the open-pored substrate increases and the deposition rate of PBN decreases as the relative volume of inert diluent gas increases. Thus the time will be chosen by the operator according to the product desired and the choices required are well within the skill of the operator.

When the deposition is complete the gas flow is stopped, the heating of the substrate in the vacuum chamber is stopped and the chamber is cooled to ambient temperature. Preferably the pressure in the chamber is reduced to from 0.01 to 0.1 Torr, with about 0.05 Torr preferred, and maintained at that level while the chamber cools to ambient temperature. The PBN-coated substrate is then removed from the chamber and a portion of the PBN coating is mechanically removed, as by sawing. The substrate is then removed by suitable means such as oxidation. When the substrate is porous carbon this can be done by heating the PBN coated substrate in an oven to a temperature of at least 500° C. and preferably about 700° C. in the presence of oxygen. This results in oxidation and removal of the substrate as a gas leaving a pure, rigid, porous article made of PBN.

Figure 1:
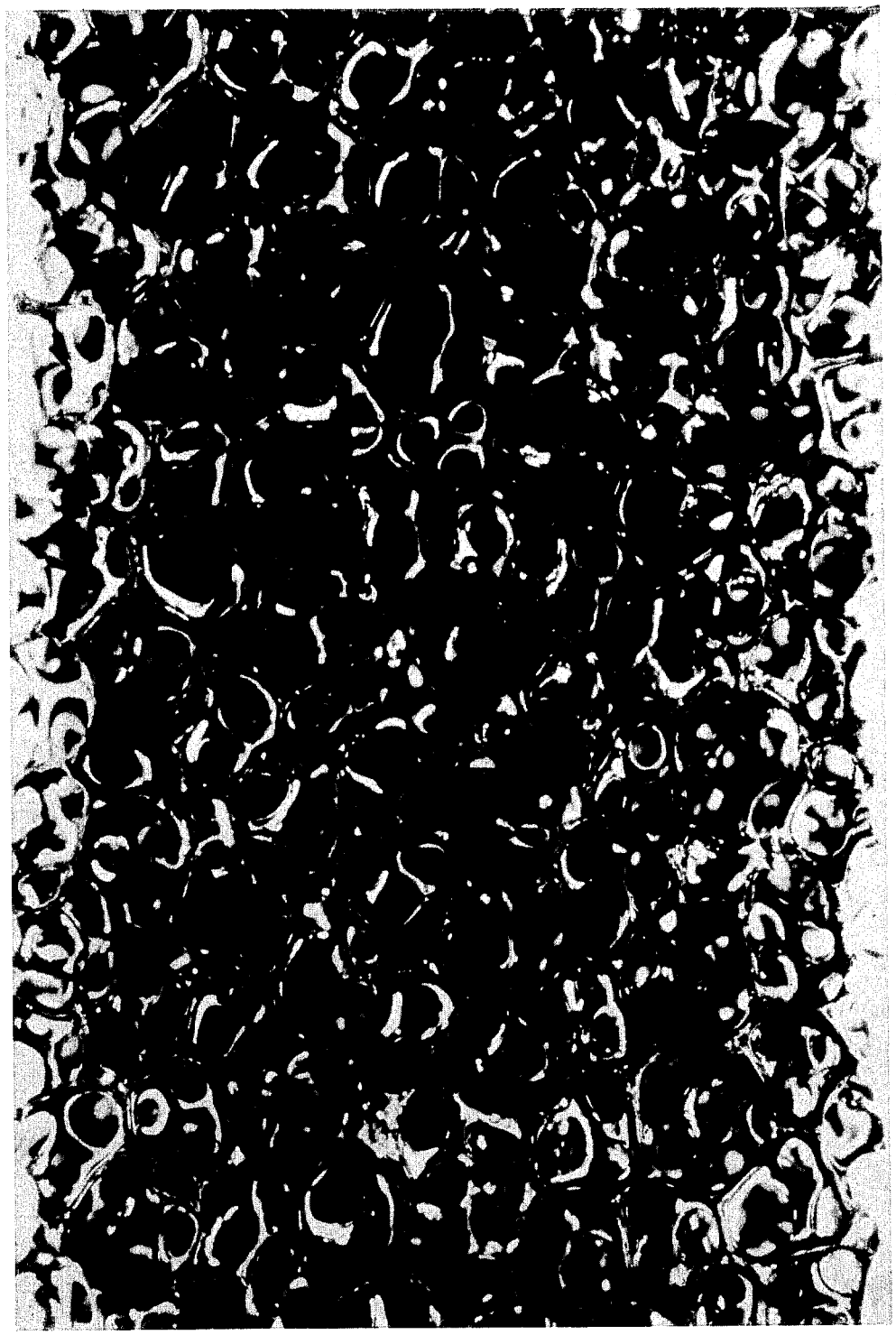
FIG. 1 is a photograph of a piece of open-pored carbon foam substrate of the type suitable for use in the invention.
Figure 2:
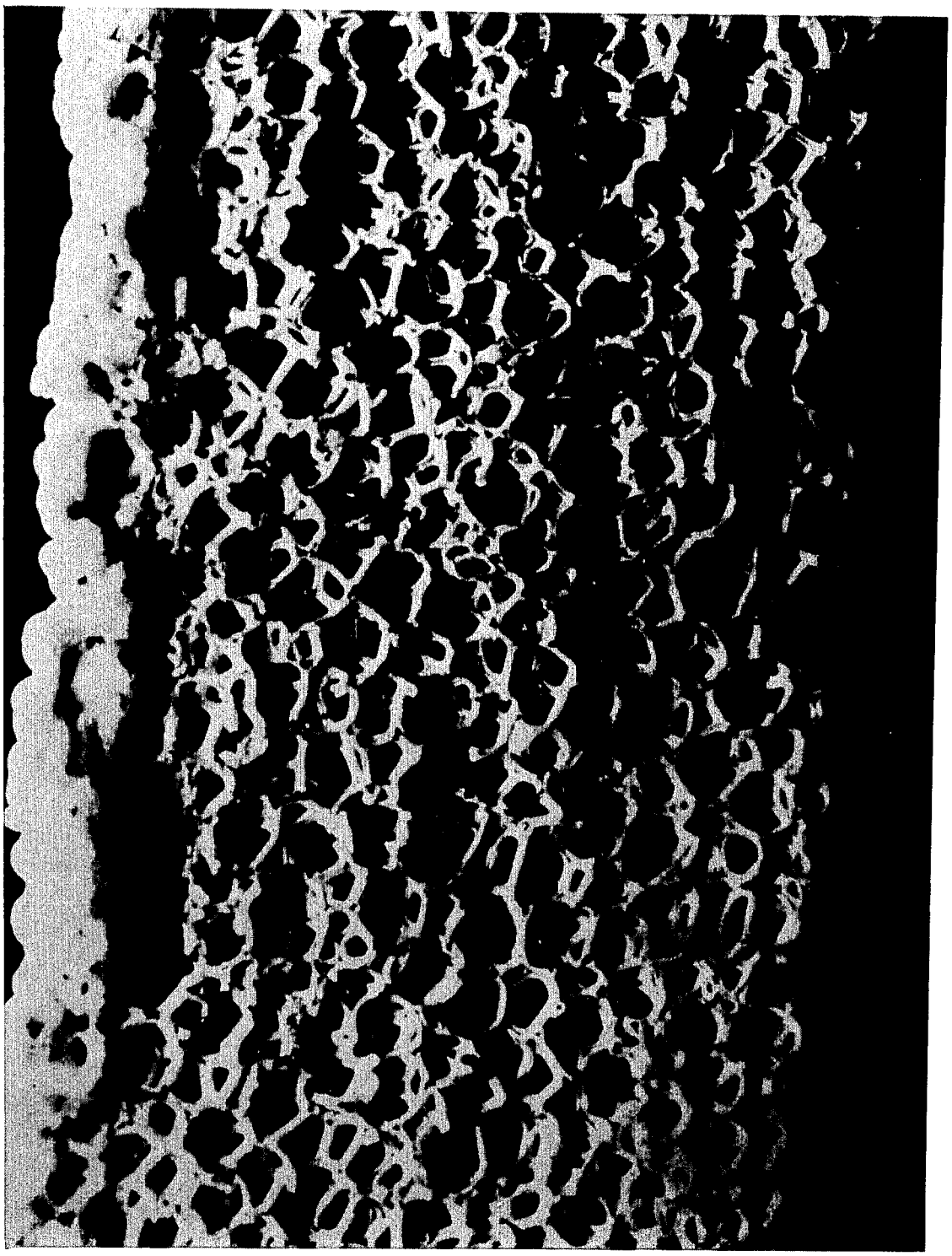
FIG. 2 is a photograph of the substrate of FIG. 1 after coating with PBN.
Figure 3:
FIG. 3 is a photograph of the porous PBN article remaining after removal of the substrate from the material of FIG. 2.

The magnification in all three figures is 25 X, although the pore sizes of the materials were not the same. The carbon foam substrate shown in FIG. 1 is a reticulated vitreous carbon made by carbonization of plastic foam. It has a nominal porosity of 45 pores per linear inch, the porosity range being from 40 to 50 pores per linear inch. In FIG. 2, PBN has been coated on a substrate of the type in FIG. 1, using the process of the invention. The coated sample has been sectioned to expose the interior. The surface of the sample has a somewhat heavier coating of PBN than the walls of the interior voids as would be expected from the greater exposure of the surface to reactant vapors. The nominal pore size of the substrate in FIG. 2 was 60 with a range of 55 to 65. A sample of nominal 45 pore substrate coated with PBN in the manner shown in FIG. 2 was oxidized according to the invention, after exposure of a substrate surface, to remove the carbon and leave a free-standing porous article composed of PBN as shown in FIG. 3. The photograph shows the surface of a section cut from the sample.

An example of the invention is as follows. A disc, 6 inches in diameter and ⅜ inch thick, of carbonized plastic foam, a reticulated vitreous carbon sold by Chemotronics International Incorporated of Ann Arbor, Michigan under the trade name RVC, was used as a substrate. The substrate was characterized by having a nominal pore size of 80 pores per linear inch, with a range of from 70 to 90 pores per linear inch and from 1400 to 1900 square feet of surface area per cubic foot. The disc was placed in a reaction chamber, a resistance heated vacuum furnace, at room temperature and the chamber was evacuated to a pressure of 0.5 Torr. The disc was then heated to a temperature of 1875° C. at the rate of 300° C./hour.

With the disc at 1875° C. there was introduced a mixture of ammonia and nitrogen in the ratio of 1.85 parts of nitrogen per part of ammonia by volume, as well as a mixture of gaseous boron trichloride and nitrogen in the ratio of 13 parts nitrogen per part of boron trichloride by volume. The ammonia and boron trichloride were continuously injected into the reaction chamber (along with their diluent nitrogen) in the ratio of 2.7 parts ammonia per part of boron trichloride by volume with the chamber pressure maintained at 0.4 Torr. As the deposition of PBN proceeded, and additional reactant laden gas was introduced into the chamber, spent diluent nitrogen and unreacted excess gases were vented as required to maintain the pressure at 0.4 Torr.

After reaction for ten hours at a temperature of 1875° C. and a pressure of 0.4 Torr all of the surface areas of the substrate disc, including the walls of the voids therein, were coated with PBN. The gas flows were then stopped, the furnace power was turned off, and the reaction vessel was evacuated to a pressure of 0.05 Torr and maintained at that pressure for approximately ten hours while the chamber cooled to room temperature. A portion of the PBN coating was then removed from the substrate disc by sawing to expose the carbonized plastic foam substrate. The disc was then placed in a muffle furnace which was maintained at a temperature of 700° C., with the door slightly ajar to maintain an oxidizing atmosphere. The disc remained in the furnace until the substrate was completely oxidized away. The resulting product was a pure, rigid, porous disc of PBN according to the invention.

What is claimed is:

1. A method of making an open-pored article of pyrolytic boron nitride (PBN) article which comprises:
   (a) forming an open-pored porous substrate in the shape desired for the PBN article,
   (b) placing said substrate in a reaction chamber and maintaining said reaction chamber at a reaction temperature of from 1700° to 2000° C. and at a reduced reaction pressure between about 0.2 and 0.5 Torr while introducing into said reaction chamber ammonia vapor diluted with a non-oxidizing gas and a gaseous boron halide diluted with a non-oxidizing gas,
   (c) maintaining said reaction chamber at said reaction temperature and reaction pressure while continuing to admit said diluted ammonia vapor and diluted gaseous boron halide and while venting spent diluent gas to maintain said reaction pressure until the desired amount of PBN has been deposited on and in said substrate,
   (d) allowing said reaction chamber to cool to ambient temperature while maintaining a non-oxidizing atmosphere in said chamber, and a pressure between about 0.01 to 0.1 Torr, and
   (e) removing the PBN coating from a portion of the surface of said substrate to expose said substrate and then removing said substrate to leave the desired porous article of PBN.

2. The method according to claim 1 wherein said substrate is an open-pored carbon foam.

3. The method according to claim 1 wherein said substrate is removed in step (e) by oxidizing away said substrate.

4. The method according to claim 1 wherein said substrate is an open-pored carbon foam and said substrate is removed in step (e) by oxidizing away said substrate in an oxidation chamber in an oxidizing atmosphere at an oxidation temperature of from 500° to 700° C.

5. The method according to claim 2, 3 or 4 wherein said carbon substrate is carbonized plastic foam.

6. The method according to claim 2, 3 or 4 wherein said carbon substrate is reticulated vitreous carbon.

7. The method according to claim 1, 2, 3 or 4 wherein said boron halide is boron trichloride.

8. The method according to claim 1, 2, 3 or 4 wherein said non-oxidizing gas is nitrogen.

9. The method according to claim 7 wherein said non-oxidizing gas is nitrogen, said reaction temperature in step (b) is about 1875° C. and said reaction pressure in step (b) is about 0.4 Torr.

10. The method according to claim 4 wherein said oxidation temperature is about 700° C.

11. The method according to claim 1 or 2 wherein said ammonia vapor in step (b) is diluted with from 1.0 to 3.0 parts by volume of non-oxidizing gas per part of ammonia.

12. The method according to claim 11 wherein said non-oxidizing gas is nitrogen.

13. The method according to claim 11 wherein said non-oxidizing gas is argon.

14. The method according to claim 1 or 2 wherein said ammonia vapor in step (b) is diluted with about 1.85 parts by volume of non-oxidizing gas per part of ammonia.

15. The method according to claim 1 or 2 wherein said gaseous boron halide in step (b) is diluted with from 10 to 15 parts by volume of non-oxidizing gas per part of boron halide.

16. The method according to claim 15 wherein said non-oxidizing gas is nitrogen.

17. The method according to claim 15 wherein said non-oxidizing gas is argon.

18. The method according to claim 1 or 2 wherein said gaseous boron halide is diluted with about 13 parts by volume of non-oxidizing gas per part of boron halide.

19. The method according to claim 1 or 2 wherein the ratio of ammonia vapors to gaseous boron halide introduced into said reaction chamber in step (b) is from 2.0 to 3.0 parts by volume of ammonia per part of boron halide.

20. The method according to claim 19 wherein said boron halide is boron trichloride.

21. The method according to claim 1 or 2 wherein the ratio of ammonia vapors to gaseous boron halide introduced into said reaction chamber in step (b) is about 2.7 parts by volume of ammonia per part of boron halide.

22. The method according to claim 17 wherein said boron halide is boron trichloride.

* * * * *